(12) United States Patent
Esser et al.

(10) Patent No.: US 7,655,858 B2
(45) Date of Patent: Feb. 2, 2010

(54) THERMOELECTRIC DEVICE HAVING AN ENERGY STORAGE DEVICE LOCATED BETWEEN ITS HOT AND COLD SIDES

(75) Inventors: Brian Esser, Colchester, VT (US); Dryver R. Huston, S. Burlington, VT (US); James O. Plumpton, Burlington, VT (US)

(73) Assignee: The University of Vermont and State Agricultural College, Burlington, VT (US)

( * ) Notice: Subject to any disclaimer, the term of this patent is extended or adjusted under 35 U.S.C. 154(b) by 692 days.

(21) Appl. No.: 10/818,113

(22) Filed: Apr. 5, 2004

(65) Prior Publication Data
US 2005/0161072 A1 Jul. 28, 2005

Related U.S. Application Data

(60) Provisional application No. 60/460,067, filed on Apr. 3, 2003.

(51) Int. Cl.
*H01L 35/04* (2006.01)
*H01L 35/28* (2006.01)
(52) U.S. Cl. ...................... 136/205; 136/224
(58) Field of Classification Search ............ 136/205, 136/200–242
See application file for complete search history.

(56) References Cited

U.S. PATENT DOCUMENTS

| | | | |
|---|---|---|---|
| 5,065,085 A * | 11/1991 | Aspden et al. ............... | 322/2 R |
| 5,576,512 A * | 11/1996 | Doke .......................... | 136/203 |
| 6,396,191 B1 | 5/2002 | Hagelstein et al. .......... | 310/306 |
| 6,495,843 B1 | 12/2002 | Tavkelidze ................ | 250/493.1 |
| 2002/0062854 A1* | 5/2002 | Sharp .......................... | 136/203 |

* cited by examiner

*Primary Examiner*—Jeffrey T Barton
(74) *Attorney, Agent, or Firm*—Downs Rachlin Martin PLLC

(57) ABSTRACT

A thermoelectric device (100, 342) that includes at least one thermoelectric couple (118, 304) that contains a thermoelectric junction (156) between two dissimilar materials (P, N) that allow exploitation of either the Seebeck effect or Peltier effect of the junction. The thermoelectric couple includes two thermoelements (120, 124, 324, 326) that extend between the hot side (104) and cold side (108) of the device. Each thermoelement has a thermally insulating region (128, 132) that insulates the hot side from the cold side and an electrical energy storage device (136, 138, 308, 310) that stores electrical energy. When operating in a Seebeck mode, each storage device may be periodically discharged by harvesting circuitry (200, 300) so as to harvest the energy stored therein. When operating in a Peltier mode, each storage device may be periodically charged by charging circuitry (900, 1000) so as to induce a temperature change at the thermoelectric junction.

9 Claims, 4 Drawing Sheets

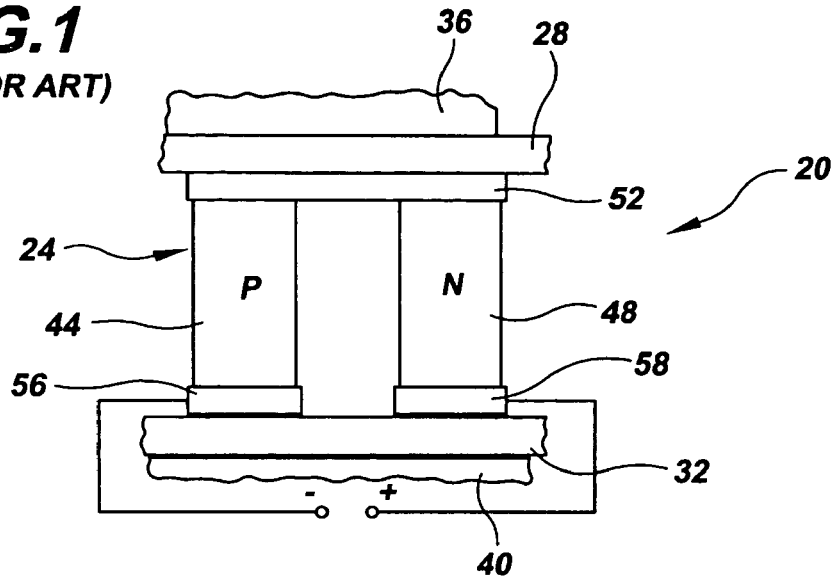
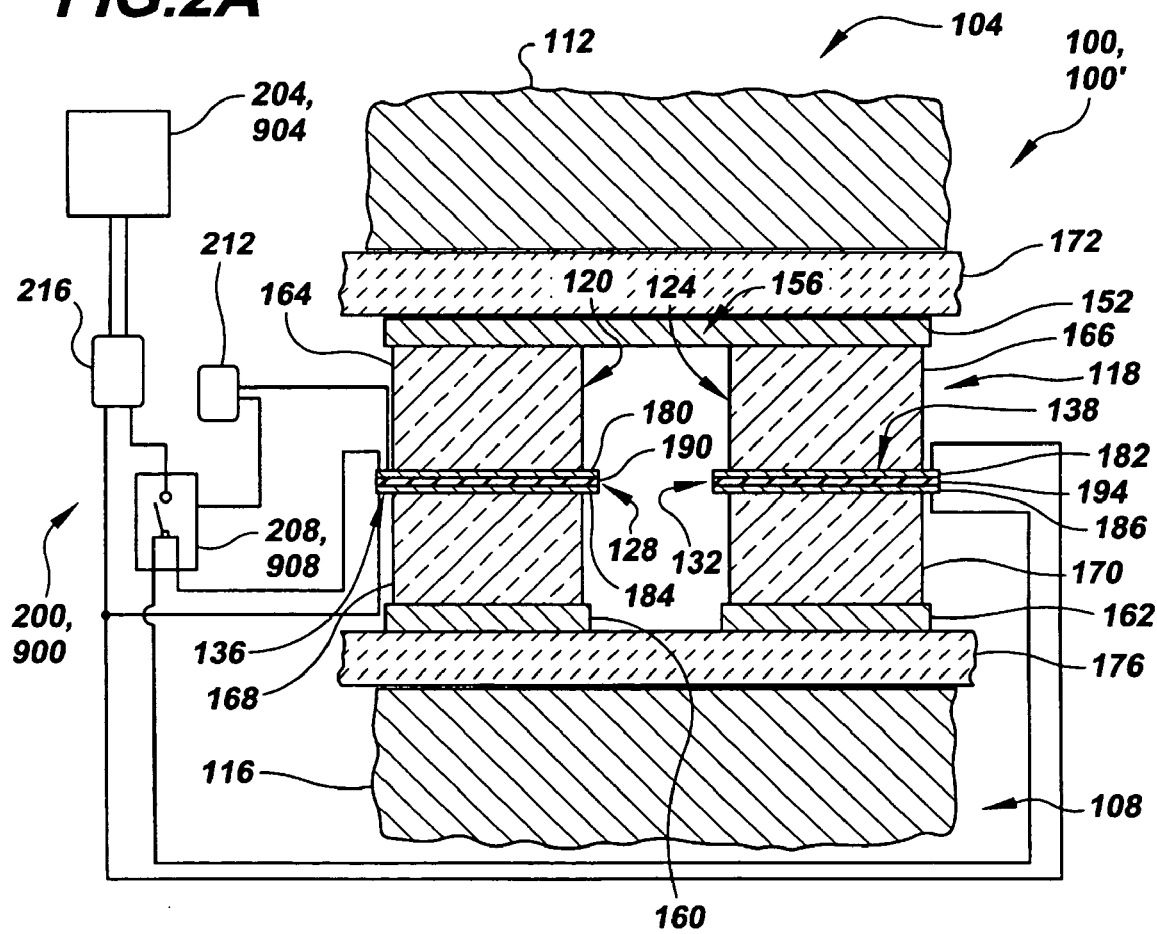

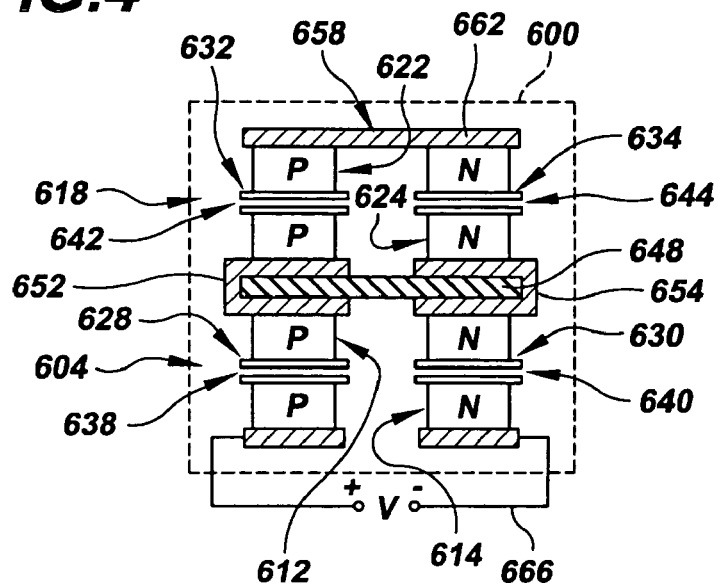
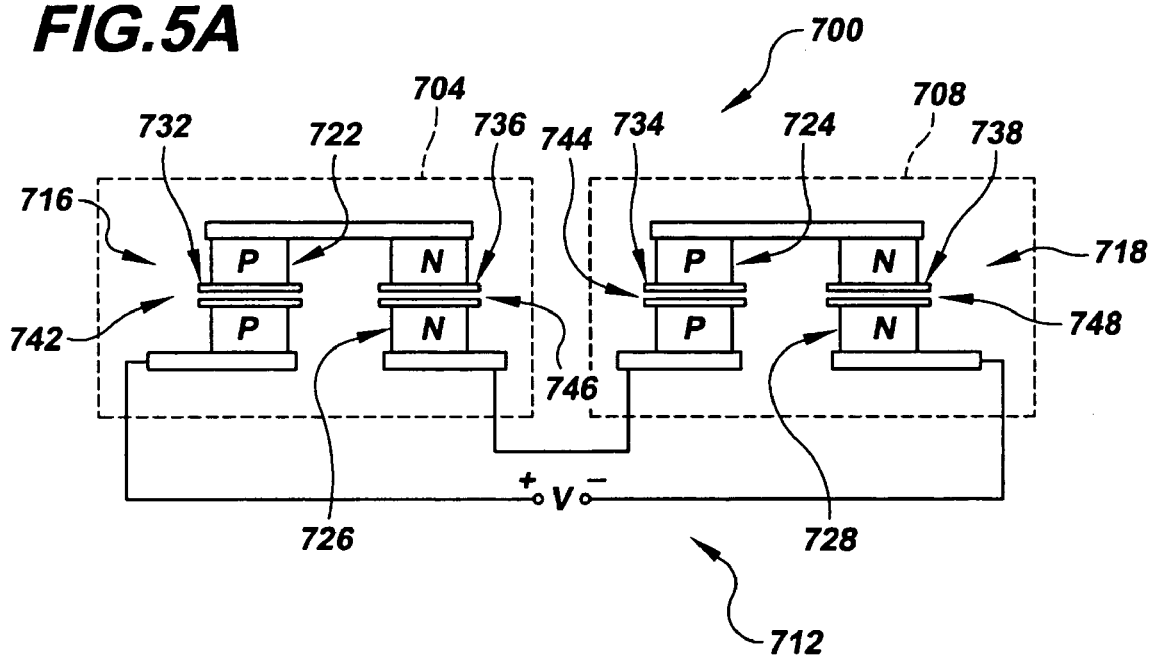

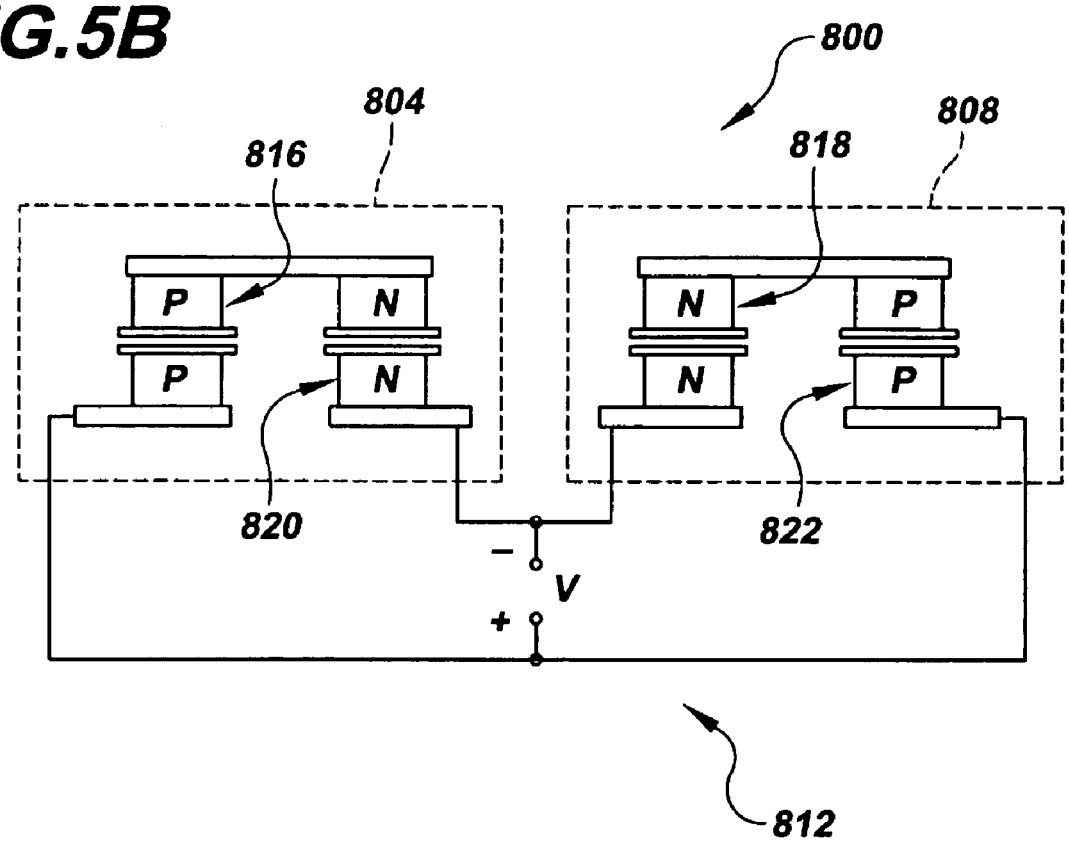

THERMOELECTRIC DEVICE HAVING AN ENERGY STORAGE DEVICE LOCATED BETWEEN ITS HOT AND COLD SIDES

RELATED APPLICATION DATA

This application claims the benefit of U.S. Provisional Patent Application Ser. No. 60/460,067, "Thermoelectric Device Having A Capacitor/Insulator Located Between Its Hot And Cold Sides," filed Apr. 4, 2003, which is incorporated herein by reference.

FIELD OF THE INVENTION

The present invention relates generally to the field of thermoelectric devices. More particularly, the present invention is directed to a thermoelectric device having an energy storage device located between its hot and cold sides.

BACKGROUND OF THE INVENTION

FIG. 1 illustrates a conventional thermoelectric device 20 that includes a thermoelectric couple 24 thermally coupled between a hot-side thermal interface member 28 and a cold-side thermal interface member 32. During use, hot-side thermal interface member 28 thermally communicates with a region or structure, e.g., a heat source 36, having a first temperature, and cold-side thermal interface member 32 thermally communicates with a region or structure, e.g., a heat sink 40, having a second temperature lower than the first temperature. Thermoelectric couple 24 includes a first thermoelement 44 and a second thermoelement 48. Often, but not necessarily, one of thermoelements 44, 48 is made of a p-type semiconductor material and the other is made of an n-type semiconductor material. Accordingly, first and second thermoelements 44, 48 are labeled, respectively, "P" and "N" as a matter of convenience for denoting that the two thermoelements are made of different materials. First and second thermoelements 44, 48 are typically electrically coupled to one another at one end by a tie contact 52 and include contacts 56, 58 at their respective other ends. Contacts 56, 58 are typically also tie contacts that electrically connect each of first and second thermoelements 44, 48 to corresponding adjacent thermoelements (not shown). Typical thermoelectric devices often comprise tens, hundreds or more thermoelectric couples.

Thermoelectric devices, such as thermoelectric device 20 of FIG. 1, operate via two general phenomena: the Seebeck effect and the Peltier effect. The Seebeck effect is where a voltage is observed when two dissimilar materials, e.g., the dissimilar materials (P and N) of first and second thermoelements 44, 48, are coupled electrically in series and thermally in parallel, and are subjected to a thermal gradient across the thermoelements. This voltage is proportional to the temperature gradient across device 20 and a property of each material known as the Seebeck coefficient.

The Peltier effect is a second, complementary effect in which a temperature difference is observed at the interface of two dissimilar thermoelectric materials, e.g., the two dissimilar materials (P and N) of second and first thermoelements 44, 48, when an electric current passes through a circuit comprising the thermoelements. Generally, the Seebeck effect is exploited to generate power from thermal gradients, and the complementary Peltier effect is exploited for cooling or heating applications, given a power source.

As a thermal engine, the performance of a thermoelectric device, such as thermoelectric device 20, is limited by the thermodynamic Carnot efficiency ($\eta_c = [T_{Hot} - T_{Cold}]/T_{Hot}$). Presently available solid-state thermoelectric devices operate at only a fraction of the potential Carnot efficiency, with overall efficiencies ranging from 3-15%. Efficiencies of this order make it exceedingly difficult for thermoelectric devices to compete with traditional methods of heating, refrigeration and power generation. The most significant contributor to such poor efficiencies is the conduction of heat through thermoelements 44, 48 from the hot to the cold side.

There are two modes by which heat conduction through thermoelements 44, 48 causes a reduction in the overall thermodynamic efficiency of thermoelectric device. The first mode concerns the distribution of heat throughout thermoelements 44, 48. In the case of power generation, heat is the energy source that thermoelectric couple 24 converts into electrical energy. Therefore, any heat conducted away from heat source 36 and distributed throughout thermoelements 44, 48 is energy that potentially could have been converted into electrical energy.

The second and more significant mode resulting in reduced efficiency due to heat conduction is the compromise of the temperature differential between hot side member 28 and cold side member 32 of thermoelectric device 20. According to the Seebeck effect, the voltage across a thermoelectric couple is directly proportional to the temperature gradient. Ideally, the temperatures of hot and cold side members 28, 32 would always remain constant, i.e., both temperatures would be unaffected by heat transfer through thermoelements 44, 48. Unfortunately, this is not realistic and heat transfer through thermoelements 44, 48 can greatly affect the temperature of either or both of hot and cold side members 28, 32. Thus, if the temperature of cold side member 32 increases due to heat conduction, the temperature gradient between hot side member 28 and the cold side member will decrease, resulting in a smaller voltage and less power generated. In one aspect, the present invention seeks to significantly increase thermoelectric device efficiencies by greatly reducing heat transfer through the thermoelements.

The present inventors are presently aware of only two known technologies in the context of thermoelectric devices that attempt to insulate against thermal conduction. The first technology utilizes thermionic emission using semiconductor thermal diodes and a complex microstructure. These materials are difficult and expensive to manufacture. There are several patents on this technology, including U.S. Pat. No. 6,396,191 to Hagelstein, et al. entitled "Thermal Diode for Energy Conversion." The second technology uses thermotunneling of electrons through a very thin (i.e., nanometer scale) barrier. There are several patents on this technology, including U.S. Pat. No. 6,495,843 to Tavkelidze entitled "Method for Increasing Emission through a Potential Barrier."

SUMMARY OF THE INVENTION

In one aspect, the present invention is directed to a thermoelectric device comprising a hot side when the thermoelectric device is operating. A cold side is spaced from the hot side when the thermoelectric device is operating. A first thermoelement has a first end in thermal communication with the hot side and a second end in thermal communication with the cold side. The first thermoelement comprises at least one electrically conducting portion and an electrical energy storage device electrically connected in series with the at least one conducting portion between the hot side and the cold side.

In another aspect, the present invention is directed to a method of transferring heat from a hot side comprising the step of placing a thermoelectric couple so that a side of the thermoelectric couple is in thermal communication with the hot side, the thermoelectric couple comprising at least one electrical energy storage device. The at least one electrical energy storage device is then periodically charged so as to cause heat to flow from the hot side via the Peltier effect.

In a further aspect, the present invention is directed to a method of powering an electrical device comprising the step of placing a thermoelectric couple so that a first side of the thermoelectric couple is in thermal communication with a hot side and so that a second side of the thermoelectric couple is in thermal communication with a cold side, the thermoelectric couple comprising at least one electrical energy storage device. Electrical energy stored as a result of the Seebeck effect is then periodically harvested from the at least one electrical energy storage device so as to power the electrical device. The harvested electrical energy is provided to the electrical device.

BRIEF DESCRIPTION OF THE DRAWINGS

For the purpose of illustrating the invention, the drawings show forms of the invention that are presently preferred. However, it should be understood that the present invention is not limited to the precise arrangements and instrumentalities shown in the drawings, wherein:

FIG. 1 is a partial elevational view/partial schematic diagram of a prior art thermoelectric device;

FIG. 2A is a partial cross-sectional view/partial schematic diagram of a thermoelectric device of the present invention.

FIG. 4 is a partial cross-sectional view/partial high-level schematic diagram of a thermoelectric module of the present invention that includes a plurality of stages of thermoelements electrically connected in series with one another;

FIG. 5A is a partial cross-sectional view/partial high-level schematic diagram of a system of the present invention comprising a plurality of thermoelectric modules electrically connected in series with one another; and FIG. 5B is a partial cross-sectional view/partial high-level schematic diagram of a system of the present invention comprising a plurality of thermoelectric modules electrically connected in parallel with one another.

DETAILED DESCRIPTION OF THE DRAWINGS

Figure 2B:
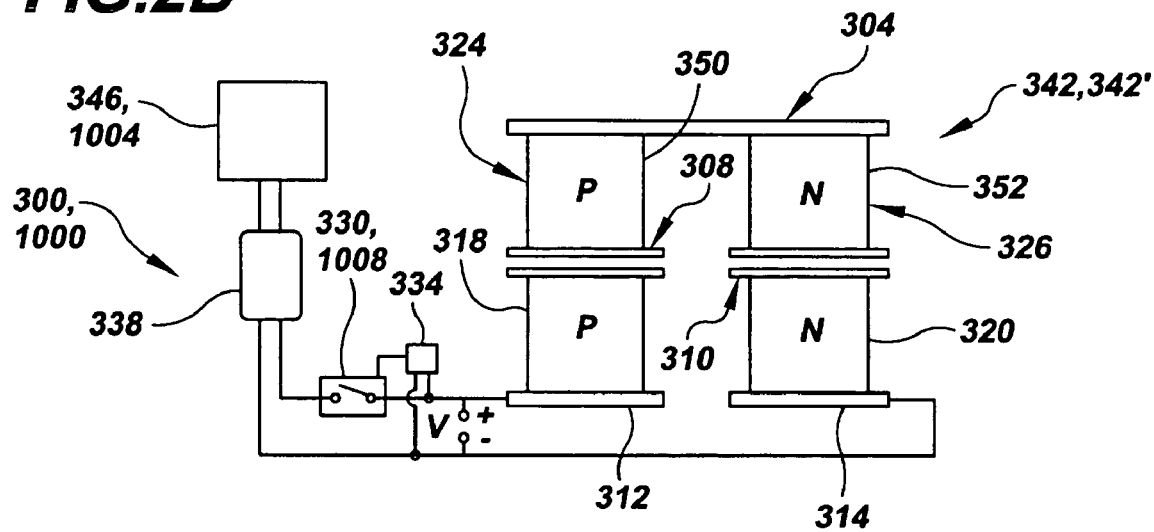
FIG. 2B is a partial elevational view/partial schematic diagram of the thermoelectric couple of FIG. 2A and alternative harvesting circuitry.

Referring again to the drawings, FIG. 2A shows in accordance with the present invention a thermoelectric device, which is generally denoted by the numeral 100. When operating, thermoelectric device 100 may be said to have a hot side 104 and a cold side 108. It is noted that the terms "hot side" and "cold side" are conventional terms used to describe thermoelectric devices and components thereof. These terms simply indicate that two portions of the thermoelectric device under consideration, e.g., thermoelectric device 100, are at temperatures different from one another.

It is noted that the use of the words "hot" and "cold," which typically indicate temperature magnitudes, do not necessarily indicate or imply any temperature magnitude of corresponding hot or cold side 104, 108, only that the temperatures of the two sides are not equal, i.e., one side is at a higher temperature than the other. This convention is used throughout this disclosure, including the claims. Further, it is noted that the conditional language "when operating" used above acknowledges the fact that when a thermoelectric device is used for cooling (or heating), the cold side may actually be hotter than the hot side of the device and the hot side may be cooler than the cold side. However, once the thermoelectric device is operating to provide cooling (or heating), the Peltier effect will result in heat being removed from the "cold side" and heat being added to the "hot side."

In general, thermoelectric device 100 is similar to conventional thermoelectric devices, e.g., thermoelectric device 20 of FIG. 1, in the respect that it may be used in substantially the same manner as a conventional thermoelectric device, e.g., as a means for generating electrical energy via a temperature gradient between a heat source 112 and a heat sink 116, as a means for cooling a hot region or heat source or as a means for heating a cold region or heat sink. However, thermoelectric device 100 of the present invention differs from conventional thermoelectric devices in several important respects. As discussed in the background section above, typical conventional thermoelectric devices have thermoelements, e.g., thermoelements 44, 48 of FIG. 1, that conduct electrical current uninterrupted from the hot side to the cold side of the device, or vice versa. Consequently, conventional thermoelements also conduct heat uninterrupted from the hot side to the cold side. As discussed above, this conducted heat can reduce the efficiency of the thermoelectric device.

In contrast to typical conventional thermoelectric devices, thermoelectric device 100 of the present invention generally comprises at least one thermoelectric couple 118 having first and second thermoelements 120, 124 that each include a thermally insulating region 128, 132 that substantially impedes the flow of heat through the thermoelements from hot side 104 to cold side 108. Since conventional good thermal insulators are typically good electrical insulators, placing a good thermal insulator in each thermally insulating region 128, 132 would typically severely impede the flow of electrons through thermoelements 120, 124 effectively rendering thermoelectric device 100 unusable for its intended application. This is so because a current must flow within thermoelectric couple 118 in order for thermoelectric device 100 to display the Seebeck or Peltier effect.

To alleviate the detrimental effects of placing a good thermal insulator in thermally insulating region 128, 132 of each thermoelement 120, 124, the present inventors have found it highly effective to provide at least one of the thermoelements, and preferably both, with an electrical energy storage device 136, 138, such as a capacitor or battery. It is noted that the term "capacitor" as used herein and in the claims includes so-called "pseudo-capacitors," such as ultracapacitors (a/k/a supercapacitors). Certain types of capacitors are particularly suitable for use in thermoelectric device 100 due to their designs that may include dielectrics that are good thermal insulators. Such dielectrics can thus function as thermally insulating region 128, 132 of each thermoelement 120, 124. With the generalities of thermoelectric device 100 of the present invention having been described above, further details and features of the device are provided below.

Referring still to FIG. 2A, first thermoelement 120 and a second thermoelement 124, when electrically coupled with one another in series as shown, form thermoelectric couple 118 in a manner similar to the manner described in the background section relative to conventional thermoelectric device 20 of FIG. 1. Thermoelectric couple 118 may include a tie contact 152 that electrically connects first thermoelement 120 in series to second thermoelement 124 at one end of the couple. Tie contact 152 may comprise any suitable electrically and thermally conductive material, such as high temperature solder, among others. When tie contact 152 is provided, a thermoelectric junction 156 between first and second thermoelements 120, 124 necessary for the Seebeck or Peltier effects to occur is essentially present across the tie contact. However, in alternative embodiments, thermoelectric junction 156 between first and second thermoelements 120, 124 may be created by the direct interfacing, e.g., direct contact, of the two thermoelements with one another. At the opposite end of thermocouple 118, one or more additional contacts 160, 162 may be provided, e.g., to electrically tie each of thermoelements 120, 124 to an adjacent thermoelement (not shown) other than the other one of thermoelements and/or to provide contacts for various circuitry as discussed below.

In addition to an energy storage device (136, 138) and a thermally insulating region (128, 132) as discussed above, each thermoelement 120, 124 may also include one or more conducting portions. For example, each thermoelement 120, 124 may have a first conducting portion 164, 166 in thermal and electrical communication with hot side 104 of thermoelectric device 100 and a second conducting portion 168, 170 in thermal and electrical communication with cold side 108. In the embodiment shown, first conducting portions 164, 166 of first and second thermoelements 120, 124 are made of materials having Seebeck coefficients different from one another. Generally, with all other variables being equal, the larger the difference between the Seebeck coefficients of the two materials, the greater the electrical energy that can be obtained from thermoelectric device 100. Materials suitable for first regions 164, 166 include all materials used for conventional thermoelements, including p-type and n-type semiconductor materials. A popular example of a base semiconductor material that may be used for the p- and n-type materials is bismuth telluride. As those skilled in the art will appreciate, however, other materials may certainly be used.

Second conducting portion 168, 170 of each first and second thermoelements 120, 124 may be made of the same material as the material of first conducting portion 164, 166 of that thermoelement. That is, second conducting portion 168 of first thermoelement 120 may be made of the same material as first conducting portion 164 and second conducting portion 170 of second thermoelement 124 may be made of the same material as first conducting portion 166. In alternative embodiments, the materials of second conducting portions 168, 170 of first and second thermoelements 120, 124 may be different from the materials in corresponding first conducting portions 164, 166. For example, if first conducting portion 164 is made of an n-type semiconductor material and first conducting portion 166 is made of a p-type semiconductor material, second conducting portions 168, 170 may be made of, respectively, the p-type and n-type semiconductor materials used in first semiconducting portions 166, 164, respectively, or, alternatively, other materials having suitable Seebeck coefficients.

Although not shown, if an additional thermoelement were provided immediately adjacent each thermoelement 120, 124, each of these additional thermoelements would typically be connected in series to the corresponding thermoelement via the corresponding one of contact 160, 162. In this case, the conducting portion 168 of the additional thermoelement 120 in electrical and thermal communication with second conducting portion 168 of first thermoelement 120 would typically be made of a material different from the material of the second conducting portion so that the difference between the Seebeck coefficients of the two materials would be suitable for the intended application. Likewise, the conducting portion of the additional thermoelement in electrical and thermal communication with second conducting portion 170 of second thermoelement 124 would typically be made of a material different from the material of second conducting portion 170 so that the difference between the Seebeck coefficients of these two materials would also be suitable for the intended application.

Still referring to FIG. 2A, thermoelectric device 100 may include a hot-side thermal interface member 172 in thermal communication with thermoelectric couple 118, e.g., via tie contact 152, if this tie contact is provided. Hot-side thermal interface member 172 may be made of a material having good or high thermal conductivity and may be adapted for engaging heat source 112, a heat sink or a region having a temperature suitable for thermoelectric device 100 to operate as desired. Similarly, thermoelectric device 100 may also include a cold-side thermal interface member 176 in thermal communication with thermocouple 118, e.g., via contacts 160, 162, if these contacts are provided. Like hot-side thermal interface member 172, cold-side thermal interface member 176 may be made of a material having good or high thermal conductivity and may be adapted for engaging heat sink 116, a heat source or a region having a temperature suitable for thermoelectric device 100 to operate as desired. In alternative embodiments, thermal interface members 172, 176 may not be part of thermoelectric device 100, but rather may be part of a device or structure, e.g., heat source 112 or heat sink 116, with which the thermoelectric device is used. In yet other alternative embodiments, one, the other or both of monolithic thermal interface members 172, 176 may be replaced by multi-member structures, as desired. Hot- and cold-side thermal interface members 172, 176 are typically, but not necessarily, dielectric and may be made of any suitable material, such as various ceramics or composite materials, among others.

As mentioned above, each electrical energy storage device 136, 138 may be a capacitor, battery or other device. Such a capacitor, battery or other device may be of any conventional design. For convenience, FIG. 2A shows each storage device 136, 138 as being a simple flat-plate capacitor comprising a first flat-plate charge condenser 180, 182 (or collector) and a second flat-plate charge condenser 184, 186 spaced apart by a dielectric layer 190, 194. First charge condensers 180, 182 are electrically coupled, respectively, to first conductive portions 164, 166 of first and second thermoelements 120, 124, and second charge condensers 184, 186 are electrically coupled, respectively, to second conductive portions 168, 170 of the thermoelements. Each dielectric layer 190, 194 may comprise any suitable dielectric that provides the necessary electrical insulation that allows the capacitor to function. Examples of suitable dielectrics include air, vacuum and various polymers, among a host of other materials. Since dielectric layers 190, 194 will typically also function as thermally insulating regions 128, 132, it is desirable to select a dielectric having a good or high thermal insulating value. Of course, other capacitor arrangements can be used, such as thin film arrangements, wherein each of first and second charge condensing plates 180, 182, 184, 186 and dielectric layers 190, 194 would essentially be replaced by multiple thin metal layers interleaved with thin dielectric layers. As those skilled in the art will appreciate, capacitors and other storage devices suitable for use as electrical energy storage devices are well known in the art and, thus, do not need to be exhaustively listed nor explained in any great detail in order to understand how to make and use thermoelectric device 100 of the present invention.

In addition, when energy storage devices 136, 138 are capacitors, those skilled in the art will readily understand how to select the proper capacitance of these devices. Since the required capacitance is generally a function of the number, electrical arrangement and materials of thermoelements 120, 124, as well as operating temperatures and nature of the use of thermoelectric device 100, it is impractical to provide exact specifications for designing the capacitors. However, once a designer has determined these and other parameters, the designer can determine the required capacitance based on elementary circuit design principles, certainly without undue experimentation. Those skilled in the art would likewise be able to design storage devices other than capacitors without undue experimentation using ordinary, well-known design principles.

When capacitors are provided for electrical energy storage devices 136, 138 and a temperature gradient exists between hot and cold sides 104, 108, dielectric layers 190, 194 between charge condensing plates 180, 184, 182, 186 of each capacitor will, of course, also substantially impede the transport of electrons through thermoelements 120, 124 from hot side 104 to cold side 108, or vice versa. However, the migration of electrons through the thermoelements 120, 124 that cause the Seebeck voltage will produce an electric potential across the capacitors. Thus, by discharging storage devices 136, 138, e.g., periodically, electrical energy stored in these devices may be harvested by harvesting circuitry 200 for use in powering an electrical device 204, such as a spacecraft, remote sensor modules or weather stations, to name just a few of many. As those skilled in the art will readily appreciate, the variety of electrical devices 204 that may be powered using thermoelectric device 100 of the present invention is large. Accordingly, it is not practical, nor necessary, to include an exhaustive list of all such devices for those skilled in the art to appreciate the broad applicability of the present invention.

That said, for the sake of providing at least one example, thermoelectric device 100 may be used to power instrumentation, i.e., device 204, or charge one or more batteries aboard a space satellite or space craft (not shown). In this example, heat source 112 may be a radiant heat collector that collects heat from the sun and heat sink 116 may be a radiator located, e.g., in the shadow of thermoelectric device 100 or other structure. This arrangement would cause a thermal gradient across thermoelectric device 100 that would charge electrical energy storage devices 136, 138. Harvesting circuitry 200 would then transfer this energy to electrical device 204 so as to provide electrical power to the device.

In one embodiment, harvesting circuitry 200 may be electrically coupled directly to electrical energy storage devices 136, 138 and include one or more switches 208 that alternatingly open and close to permit the storage devices to become charged by the Seebeck effect and then discharge to the harvesting circuitry. Each switch 208 may be any conventional switching device, including a transistor-based device. Each switch may be controlled by one or more switch controllers 212 that, e.g., sense the charge state of one or more electrical energy storage devices 136, 138 and actuate each switch when the controller(s) determine(s) that the storage devices are suitably charged. Such determination may be accomplished using a high-impedance comparator (not shown), among other devices.

Harvesting circuitry 200 may optionally include signal conditioning circuitry 216 for adjusting the magnitudes of the voltage and current flowing through switch 208 and/or smoothing the periodic waveform that results from the periodic operation of the switch. It is noted that many arrangements of harvesting circuitry 200 are possible, some due to the electrical arrangement of the one or more thermoelectric couples 118 within thermoelectric device 100. For example, thermoelectric device 100 may include a plurality of groupings of thermoelectric couples 118 electrically isolated from one another so that electrical energy storage devices 136, 138 within each group may be discharged at different times from one another to produce a smoother waveform. Harvesting circuitry 200 could readily be configured for implementing this scheme. With an understanding of the underlying principles of thermoelements 120, 124 of the present invention discussed above, those skilled in the art will readily appreciate that the variety of configurations of harvesting circuitry 200 is large and that it is not practical, nor necessary, to include an exhaustive list of all possible configurations for those skilled in the art to appreciate the broad applicability of the present invention. Moreover, those skilled in the art can design functional energy harvesting circuitry 200 using elementary circuit design principles.

Alternative electrical energy harvesting circuitry 300 is shown in FIG. 2B relative to a thermoelectric couple 304 that is essentially the same as thermoelectric couple 118 of FIG. 2A. Rather than harvesting electrical energy directly from electrical energy storage devices 308, 310, harvesting circuitry 300 of FIG. 2B harvests energy via contacts 312, 314 through second portions 318, 320 of thermoelements 324, 326. Like harvesting circuitry 200 of FIG. 2A, harvesting circuitry 300 of FIG. 2B may include various components for facilitating the harvesting, including, but not limited to, one or more switches 330, switch controllers 334 and signal conditioning circuitry 338. Also similar to harvesting circuitry 200 of FIG. 2A, depending upon the desired level of integration, none, some or all of energy harvesting circuitry 300 may be packaged aboard thermoelectric device 342. If all of harvesting circuitry 300 is not placed aboard thermoelectric device 342, the components not aboard the thermoelectric device may be integrated into an electrical device 346 and/or an interface device electrically coupled between the thermoelectric device and the electrical device.

As mentioned above, although non-semiconductor materials may be used for first and second conducting portions 350, 352, 318, 320 of first and second thermoelements 324, 326, p- and n-type semiconductor materials are often used. Accordingly, first and second portions 350, 352, 318, 320 of first and second thermoelements 324, 326 are as a matter of convenience labeled with either a "P" or an "N" that corresponds to the type of material of which that portion may be made. However, since the materials for first and second portions 350, 352, 318, 320 of first and second thermoelements 324, 326 may be materials other than p- and n-type semiconductor materials, the designations "P" and "N" may also be interpreted as simply representing two different materials. In addition, although first and second portions 350, 318 of first thermoelement 324 are labeled "P" so as to indicate a first material, e.g., a p-type semiconductor material, and first and second portions 352, 320 of second thermoelement 326 are labeled "N" so as to indicated a second, different material, e.g., an n-type semiconductor material, the materials may be reversed, i.e., the "P" and "N" materials swapped for one another. This would cause the polarities across the two sides of harvesting circuitry 300 to reverse.

Figure 3A:
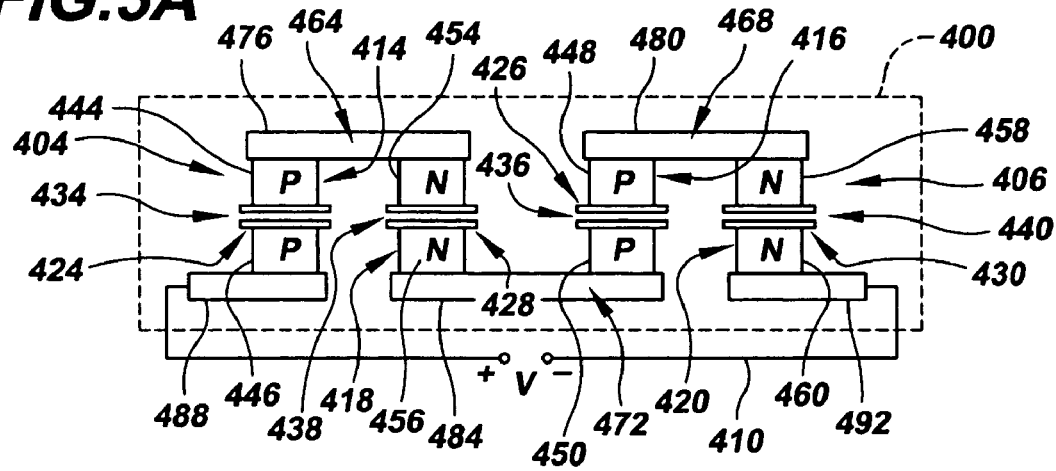
FIG. 3A is partial elevational view/partial high-level schematic diagram of a thermoelectric module of the present invention that includes a plurality of thermoelements electrically connected in series with one another.
Figure 3B:
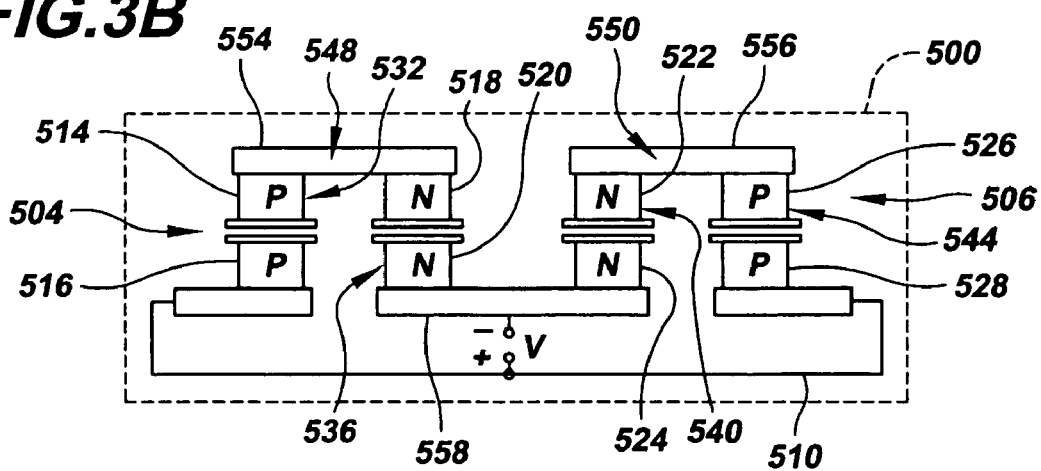
FIG. 3B is a partial elevational view/partial high-level schematic diagram of a thermoelectric module of the present invention that includes a plurality of thermoelements electrically connected in parallel with one another.

Thermoelectric couples, such as thermoelectric couples 118, 304 are typically, but not necessarily, used in various numbers to construct thermoelectric modules. FIGS. 3A, 3B, and 4 illustrate some exemplary arrangements of thermoelectric couples that may be used in thermoelectric modules of the present invention, and FIGS. 5A and 5B illustrate some exemplary arrangements of thermoelectric modules with one another.

FIG. 3A shows a thermoelectric module 400 having a plurality of thermoelectric couples 404, 406 configured for being electrically connected in series with one another, as shown. This series connection is primarily represented in harvesting circuitry 410. It is noted that two thermoelectric couples 404, 406 are shown for convenience, however, there could be one or many more thermocouples as desired to suit a particular design. Similar to harvesting circuitries 200, 300 discussed in connection with FIGS. 2A and 2B, harvesting circuitry 410 may be fully or partially located outside module 400 or fully contained within the module. As shown, at least a portion of harvesting circuitry 410 is outside of module 400. Although not shown, harvesting circuitry 410 may include other components, such as one or more switches, switch controllers and signal conditioning circuitry, among others, also as discussed above in connection with FIGS. 2A and 2B. Module 400 may also include other elements, such as hot and cold side thermally conducting members (not shown), similar to thermoelectric device 100 of FIG. 2A.

Each thermoelectric couple 404, 406 may include first and second thermoelements 414, 416, 418, 420, each containing an electrical energy storage device 424, 426, 428, 430 and a thermally insulating region 434, 436, 438, 440, both in manners similar to or the same as discussed above relative to FIG. 2A. To create the series circuit through thermoelectric couples 404, 406, each conductive portion 444, 446, 448, 450 of first thermoelements 414, 416 may be of one material type, denoted "P," and each conductive portion 454, 456, 458, 460 of second thermoelements 418, 420 may be of a different materials type, denoted "N." This series configuration forms three thermoelectric junctions 464, 468, 472 across the corresponding tie contacts 476, 480, 484 that electrically connect a "P" designated conducting portion 444, 446, 448, 450 to an "N" designated conducting portion 454, 456, 458, 460. Tie contacts 476, 480, 484 and circuitry contacts 488, 492 may be made of any suitable conducting material.

FIG. 3B shows a thermoelectric module 500 similar to thermoelectric module 400 of FIG. 3A, but has the following differences. (Again, only two thermoelectric couples are shown for convenience.) First, thermoelectric couples 504, 506 are electrically connected in parallel with one another, as indicated primarily by harvesting circuitry 510. This parallel nature of thermoelectric couples 504, 506 results in a different arrangement of materials for first and second conducting portions 514, 516, 518, 520, 522, 524, 526, 528 of the thermoelements 532, 536, 540, 544. In this case, thermoelectric junctions 548, 550 are present across each of tie contacts 554, 556, while tie contact 558 provides a contact between the like (N) materials of second conducting portions 520, 524 of adjacent thermoelements 536, 540. The second difference is that harvesting circuitry 510 is contained entirely within thermoelectric module 500. Like thermoelectric module 400 of FIG. 3A, harvesting circuitry 510 and other components of module 500 may be as described above in connection with FIGS. 2A and 2B.

FIG. 4 shows a two-stage thermoelectric module 600 of the present invention that includes a first level, or stage 604, of thermoelements 612, 614 and a second stage 618 of thermoelements 622, 624 electrically connected in series with the thermoelements of the first stage. Each thermoelement 612, 614, 622, 624 may include an electrical energy storage device 628, 630, 632, 634 and a thermally insulating region 638, 640, 642, 644 in manners described above relative to FIG. 2A. An electrically non-conductive, but thermally conductive layer 648 may be placed between first and second stages 604, 618. If thermally conductive layer 648 is provided, it may be in thermal communication with a heat source or heat sink (not shown) in a manner similar to the hot or cold side thermal interface members (not shown, but similar to thermal interface members 172, 176 of FIG. 2A), as desired to suit a particular design. In addition, if electrically non-conductive layer 648 is provided, first thermoelements 612, 622 of first and second stages 604, 618 and second thermoelements 614, 624 of the first and second stages may be electrically connected to one another via tie contacts 652, 654. A thermoelectric junction 658 is formed across tie contact 662. Of course each of first and second stages 604, 618 may be made up of many more thermoelements, if desired. In addition, more than two stages 604, 618 may be provided. At least a portion of harvesting circuitry 666 may be provided outside module 600, if desired. Harvesting circuitry 666 and other components (not shown) of thermoelectric module 600 may be similar to such components of thermoelectric device 100 of FIG. 2A.

FIG. 5A illustrates a system 700 containing an electrical coupling of two thermoelectric modules 704, 708 of the present invention in series with one another via harvesting circuitry 712. Although FIG. 5A shows each module 704, 708 as comprising one thermoelectric couple 716, 718 for convenience, those skilled in the art will readily appreciate that each module may include any number of thermoelectric couples desired. Each thermoelectric couple 716, 718 include respective first and second thermoelements 722, 724, 726, 728, each of which may include an energy storage device 732, 734, 736, 738 and a thermally insulating region 742, 744, 746, 748 as discussed above relative to FIG. 2A. Of course, each module 704, 708 may include other components (not shown), e.g., hot and cold side thermally conductive members, in a manner similar to thermoelectric device 100 of FIG. 2A. Likewise, harvesting circuitry 712 of FIG. 5A may include other components (not shown), e.g., one or more switches, switch controllers and signal conditioning circuitry, similar to harvesting circuitry 200 of FIG. 2A.

FIG. 5B shows a system 800 similar to system 700 of FIG. 5A, except that modules 804, 808 of FIG. 5B are electrically connected in parallel with one another via harvesting circuitry 812. Note the differences in materials between thermoelements 816, 818, 820, 822 of FIG. 5B and corresponding (by location) thermoelements 722, 724, 726, 728 of FIG. 5A necessary to implement parallel electrical connectivity rather than series electrical connectivity.

Although the present invention has largely been described above with respect to the Seebeck effect, those skilled in the art will readily appreciate that the complementary Peltier effect may also be exploited. Relative to FIGS. 2A and 2B, harvesting circuitries 200, 300 and electrical devices 204, 346 would be replaced, respectively, by charging circuitries 900, 1000 and electrical energy sources 904, 1004, such as batteries or other electrical power supplies. Like harvesting circuitries 200, 300, each set of charging circuitry 900, 1000 may include one or more switches 908, 1008 that alternatingly open and close to periodically allow corresponding electrical energy storage devices 136, 138, 308, 310 to periodically discharge and charge. When the respective storage devices 136, 138, 308, 310 discharge, depending upon the direction of current through the thermoelectric junctions of thermocouples 118, 304, the Peltier effect will cause heat to be adsorbed on the cold side (104) and heat to be generated on the hot side (108). Like energy harvesting circuitries 200, 300, those skilled in the art will understand how to design charging circuitries 900, 1000 for virtually any configuration of thermoelectric devices using well-known circuit design principles. Also similar to energy harvesting circuitries 200, 300, none, some or all of charging circuitries 900, 1000 may be packaged aboard thermoelectric devices 100', 342', with any components not provided aboard the thermoelectric devices integrated into electrical energy sources 904, 1004 and/or an interface device (not shown), as desired. Harvesting circuitries 410, 510, 666, 712, 812 of FIGS. 3A, 3B, 4, 5A and 5B, respectively, may similarly be replaced with suitable charging circuitry in order to exploit the Peltier effect of device 342 and modules 400, 500, 600, 704, 708, 804, 808 rather than the Seebeck effect.

The present invention appears to be the first application of reducing heat transfer from source to sink using energy storage devices in series with the thermoelements of various thermoelectric devices. The expected reduction in heat transfer between the hot and cold sides of a thermoelectric device of the present invention has the potential to drastically increase the efficiencies of these devices, potentially leading to more widespread use of thermoelectric devices.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A system, comprising:
    a first single-thermoelectric-junction thermoelectric couple that includes:
        a hot side when the system is operating;
        a cold side spaced from said hot side when the system is operating;
        a first thermoelement having a first end in thermal communication with one of said hot side and said cold side, and a second end in thermal communication with the other of said hot side and said cold side, said first thermoelement comprising at least one first electrical and thermal conducting portion and a first energy storage device that includes a first insulating region connected in series with said at least one first electrical and thermal conducting portion between said hot side and said cold side so as to inhibit flow of heat through said first thermoelement and to inhibit the flow of electricity across said first energy storage device;
        a second thermoelement having a third end in thermal communication with the one of said hot side and said cold side in which said first end of said first thermoelement is in thermal communication, and a fourth end in thermal communication with the other of said hot side and said cold side in which said second end of said first thermoelement is in thermal communication, said second thermoelement comprising at least one second electrical and thermal conducting portion and a second energy storage device that includes a second insulating region connected in series with said at least one second electrical and thermal conducting portion between said hot side and said cold side so as to inhibit flow of heat through said second thermoelement and to inhibit the flow of electricity across said second energy storage device; and
        only one thermoelectric junction, said thermoelectric junction being formed by and between said first end of said first thermoelement and said third end of said second thermoelement; and
    energy harvesting circuitry in electrical communication with each of said first energy storage device and said second energy storage device for periodically harvesting electrical energy from said first energy storage device and said second energy storage device.

2. The system of claim 1, wherein said energy harvesting circuitry includes:
    a switch for opening and closing a circuit that includes said first energy storage device and a second energy storage device; and
    a switch controller for controlling said switch as a function of a magnitude of charge stored on at least one of: 1) said first energy storage device and 2) said second energy storage device.

3. The system of claim 2, wherein said switch controller includes a charge sensor for sensing charge buildup on at least one of: 1) said first energy storage device and 2) said second energy storage device.

4. The system of claim 1, wherein said first energy storage device includes a first side and a second side electrically separated by said first insulating region and said second energy storage device includes a third side and a fourth side electrically separated by said second insulating region, said energy harvesting circuitry electrically connected to each of said first side, said second side, said third side and said fourth side.

5. The system of claim 4, wherein each of said first energy storage device and said second energy storage device comprises a capacitor that includes a first condenser plate and a second condenser plate, said energy harvesting circuitry directly electrically connected to ones of said first condenser plate and said second condenser plate.

6. The system of claim 1, wherein said first energy storage device includes a first side and a second side electrically separated by said first insulating region and said second energy storage device includes a third side and a fourth side electrically separated by said second insulating region, said energy harvesting circuitry electrically connected to only said first side and said third side.

7. The system of claim 1, wherein said energy harvesting circuitry further comprises signal conditioning circuitry for smoothing a periodic waveform resulting from switching of said switch.

8. The system of claim 1, comprising a plurality of thermoelectric couples each substantially identical to said first single-thermoelectric-junction thermoelectric couple, wherein ones of said plurality of thermoelectric couples are not directly electrically coupled to one another, said energy harvesting circuitry in electrical communication with said ones of said plurality of thermoelectric couples and operatively configured to stagger discharge of ones of said first and second energy storage devices across said plurality of thermoelectric couples so as to smooth an output of said energy harvesting circuitry.

9. The system of claim 1, further comprising a thermal conductor located between and spaced from said hot side and said cold side, wherein said first thermoelectric couple is a multistage thermoelectric couple in which each of said first and second thermoelements includes a series-connected energy storage device on each side of said thermal conductor.

\* \* \* \* \*